(12) United States Patent
Kondo et al.

(10) Patent No.: US 6,199,756 B1
(45) Date of Patent: Mar. 13, 2001

(54) MEMORY CARD, AND RECEPTACLE FOR SAME

(75) Inventors: Yoshio Kondo, Chiba; Toshiharu Kobayashi, Tokyo; Takumi Okaue, Kanagawa; Akira Sassa, Saitama, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/483,115

(22) Filed: Jan. 14, 2000

Related U.S. Application Data

(63) Continuation of application No. 09/088,590, filed on Jun. 2, 1998.

(30) Foreign Application Priority Data

Jun. 4, 1997 (JP) .................................................... 9-146914
Sep. 30, 1997 (JP) .................................................... 9-267181

(51) Int. Cl.⁷ .............................. G06K 19/06; G11C 5/00
(52) U.S. Cl. .......................... 235/380; 235/382; 235/487; 235/492; 257/693; 257/730; 361/728
(58) Field of Search .................................... 235/380, 382, 235/487, 492; 257/693, 730; 361/728

(56) References Cited

U.S. PATENT DOCUMENTS 5,581,127 * 12/1996 Shinohara ............................. 257/679
5,892,660 * 4/1999 Farnworth et al. ................... 361/728

FOREIGN PATENT DOCUMENTS

| | | |
|---|---|---|
| 60-53144 | 4/1985 | (JP) . |
| 61-55295 | 4/1986 | (JP) . |
| 61-126485 | 8/1986 | (JP) . |
| 62-7686 | 1/1987 | (JP) . |
| 62-97896 | 5/1987 | (JP) . |
| 62-112767 | 7/1987 | (JP) . |
| 62-119274 | 7/1987 | (JP) . |
| 62-184894 | 8/1987 | (JP) . |
| 62-147064 | 9/1987 | (JP) . |
| 363090092 * | 4/1988 | (JP) . |
| 63-90092 | 4/1988 | (JP) . |
| 63-148457 | 6/1988 | (JP) . |
| 63-135464 | 9/1988 | (JP) . |
| 2-5138 | 1/1990 | (JP) . |
| 2-35584 | 2/1990 | (JP) . |
| 2-123491 | 5/1990 | (JP) . |
| 4-286089 | 10/1992 | (JP) . |
| 5-108898 | 4/1993 | (JP) . |
| 8-72418 | 12/1993 | (JP) . |
| 5-334787 | 3/1996 | (JP) . |
| 8-130061 | 5/1996 | (JP) . |
| 9-198834 | 7/1997 | (JP) . |

* cited by examiner

Primary Examiner—Viet Q. Nguyen
(74) Attorney, Agent, or Firm—Frommer Lawrence & Haug, LLP.; William S. Frommer

(57) ABSTRACT

A memory card is disclosed which has a card body (2) having a concavity (9) formed at the forward end thereof in the inserting direction and in which terminals (5) are disposed and projections (10) are formed between the terminals (5) to prevent the terminals (5) from being touched or accessed from outside. A receptacle for the memory card is also disclosed. The memory card has a simple structure designed to positively protect the terminals and easily let out dust or the like from inside, thereby permitting to assure a positive connection with the receptacle.

9 Claims, 20 Drawing Sheets

MEMORY CARD, AND RECEPTACLE FOR SAME

This is a continuation of application Ser. No. 09/088,590, filed Jun. 2, 1998.

BACKGROUND OF THE INVENTION

1. Field of the Invention

The present invention relates to a memory card designed for reception in a memory card receptacle and into or from which information signal is to be written or read, and the memory card receptacle.

2. Description of Related Art

A well-known memory card incorporating memory chips in which information signals are stored is provided with terminals which are to electrically be connected with an external system. The memory card is supplied with a voltage through the terminals and also delivers and receives information signal to and from the internal memory chips through the terminals.

Since the terminals for connection of the memory card to an external system are also electrically connected to the internal memory chips, they should be protected from being touched when the memory card is used. More particularly, if the terminals are directly touched, a static electricity will take place in them, which however is a rare case, and be carried from the terminals to the memory chips which thus will possibly be broken down. To avoid this, the terminals should be protected against easy access to them from outside to prevent such a breakdown due to a static electricity.

Also, the memory card of this type is featured by its transportability. So, it has been tried to design more compact memory cards for the convenience of portability. Thus, along with the more compact design of the memory card itself, its terminals have been designed thinner and arranged at reduced intervals.

Such thin, closely disposed terminals for connection an external system will possibly be deformed and broken even if just lightly touched.

To prevent the terminals from being deformed or broken down, a memory card of this type has been proposed in which such terminals are buried inside in the memory card body and small holes communicating with the terminals are formed in the memory card body so that the terminals are exposed to outside only through the holes, or in which a concavity is formed in a forward end portion of the memory card body in the card inserting direction and terminals are disposed in the bottom of the concavity for protection of them.

However, the memory card in which the small holes are formed in the card body for the terminals to be exposed to outside is hard to disconnect from the receptacle if the holes are clogged with dust or the like. When the memory card is inserted into the receptacle with the holes left clogged with dust, no positive connection with the receptacle can be attained and also the terminals of the receptacle may possibly be deformed as the case may be.

Further, the above memory card is apt to have a complicated structure and is manufactured with large costs. Therefore, the conventional memory card is not suitable for mass production.

Also, in the memory card having formed in the body thereof the concavity in which the terminals are disposed, the protection of the terminals cannot be protected to a satisfactory extent if the concavity is improperly shaped. If the concavity is not shaped for a satisfactory protection of the terminals, dust or the like is likely to heap or stay in the corners of the concavity and block the terminals of the memory card from secure connection with those of the receptacle.

Further a memory card has been proposed which is cut at one of the corners of a generally rectangular body thereof to prevent the memory card from being inserted incorrectly (in a wrong direction or posture) into a memory card receptacle. In this case, however, the memory card cannot be designed to have a variety of shapes by chamfering or rounding, for example, the other three corners.

SUMMARY OF THE INVENTION

The present invention has an object to overcome the above-mentioned drawbacks of the prior art by providing a memory card having a simple structure, adapted to positively protect terminals thereof and easily let out dust or the like from inside to attain a positive connection with a memory card receptacle, and designable to have a variety of corner shapes, and the memory card receptacle.

The above object can be accomplished by providing a memory card comprising a body, a concavity formed in the card body which is open at the top and forward end of the card body in the inserting direction of the latter, and terminals disposed in the concavity. The memory card has also a projection formed in at least a part of a space defined between two successive ones of the terminals disposed in the concavity to protect the terminals against access or touch from outside, and the inner wall of the concavity perpendicular to the inserting direction of the card body is inclined.

In this memory card, the projections are formed in the concavity to define sockets in each of which a terminal is disposed, whereby the terminals thus disposed in the concavity can be protected against access or touch from outside.

Since the concavity has the inclined inner wall, dust or the like, if any, can easily be let out from on the concavity wall when the memory card is inserted into a memory card receptacle.

The above object can also be accomplished by providing a memory card comprising a body, a concavity formed in the card body and open at the top and forward end, in the inserting direction, of the card body, and terminals disposed in the concavity. The memory card has also a shutter member which opens and closes the concavity, and the inner wall of the concavity perpendicular to the inserting direction of the memory card is inclined.

When the memory card is not inserted into a memory card receptacle, the concavity is closed by the shutter member so that the terminals disposed inside the concavity cannot be accessed or touched from outside.

When the memory card is inserted into a memory card receptacle, dust or the like is removed to outside from the inclined wall of the concavity.

Also the above object can be accomplished by providing a memory card receptacle having a receiving concavity formed therein, a plurality of terminals disposed in the receiving concavity, and a plurality of projections provided ahead of the plurality of terminals correspondingly to the terminals of a memory card.

When the memory card is inserted into the receptacle, the projections go ahead of the receptacle terminals and slide on the memory card terminals to let out dust or the like from on the memory card receptacle.

BRIEF DESCRIPTION OF THE DRAWINGS

These objects and other objects, features and advantages of the present intention will become more apparent from the following detailed description of the preferred embodiments of the present invention when taken in conjunction with the accompanying drawings, of which.

DETAILED DESCRIPTION OF THE PREFERRED EMBODIMENTS

A memory card according to the present invention is generally indicated with a reference 1.

Figure 1A:
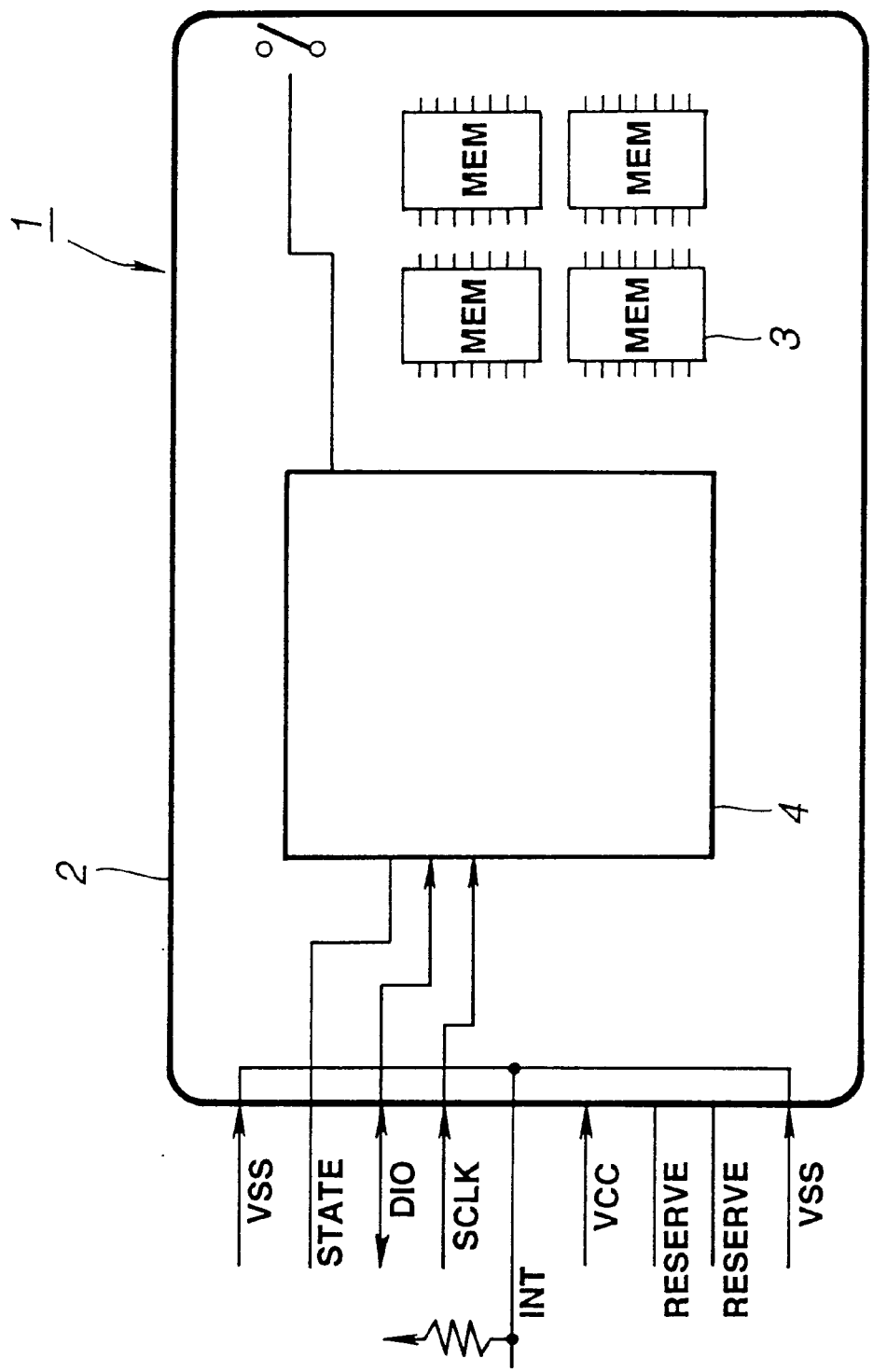
FIG. 1A shows the construction of a first embodiment of the memory card according to the present invention.
Figure 1B:
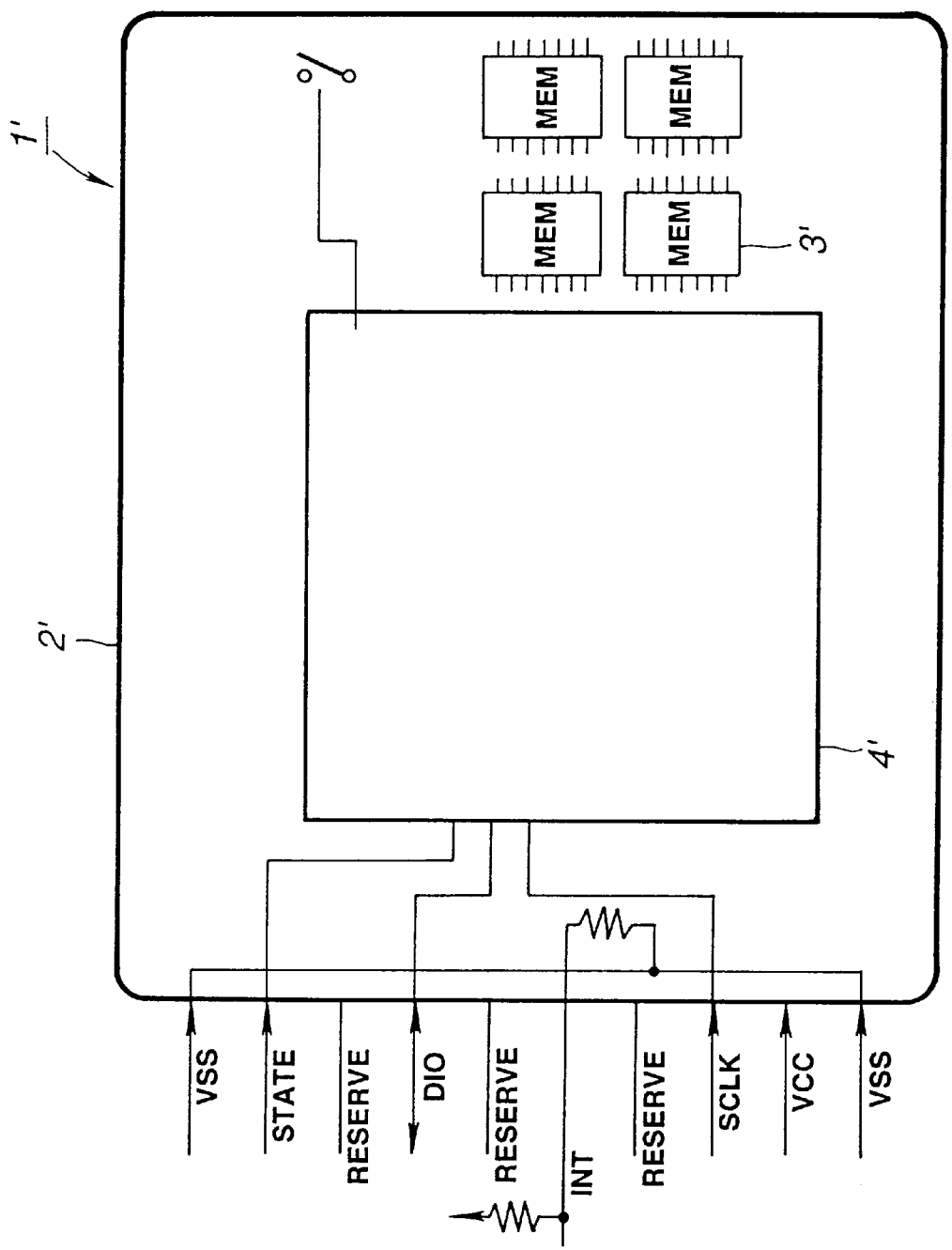
FIG. 1B shows the construction of a second embodiment of the memory/card of the present invention.

It is a storage medium which is inserted, for use, into a receptacle of an external system such as a computer, audio equipment, etc. for read or write of information signal between the memory card and external system thus connected to the memory card. As shown in FIGS. 1A and 1B, the memory card 1 has a card body 2 incorporating a plurality of memory chips 3 such as flash memory, etc. to store information signal, and a controlling integrated circuit 4 (will be referred to as "controlling IC" hereafter) to write or read information signal into or from the memory chips 3.

Figure 2:
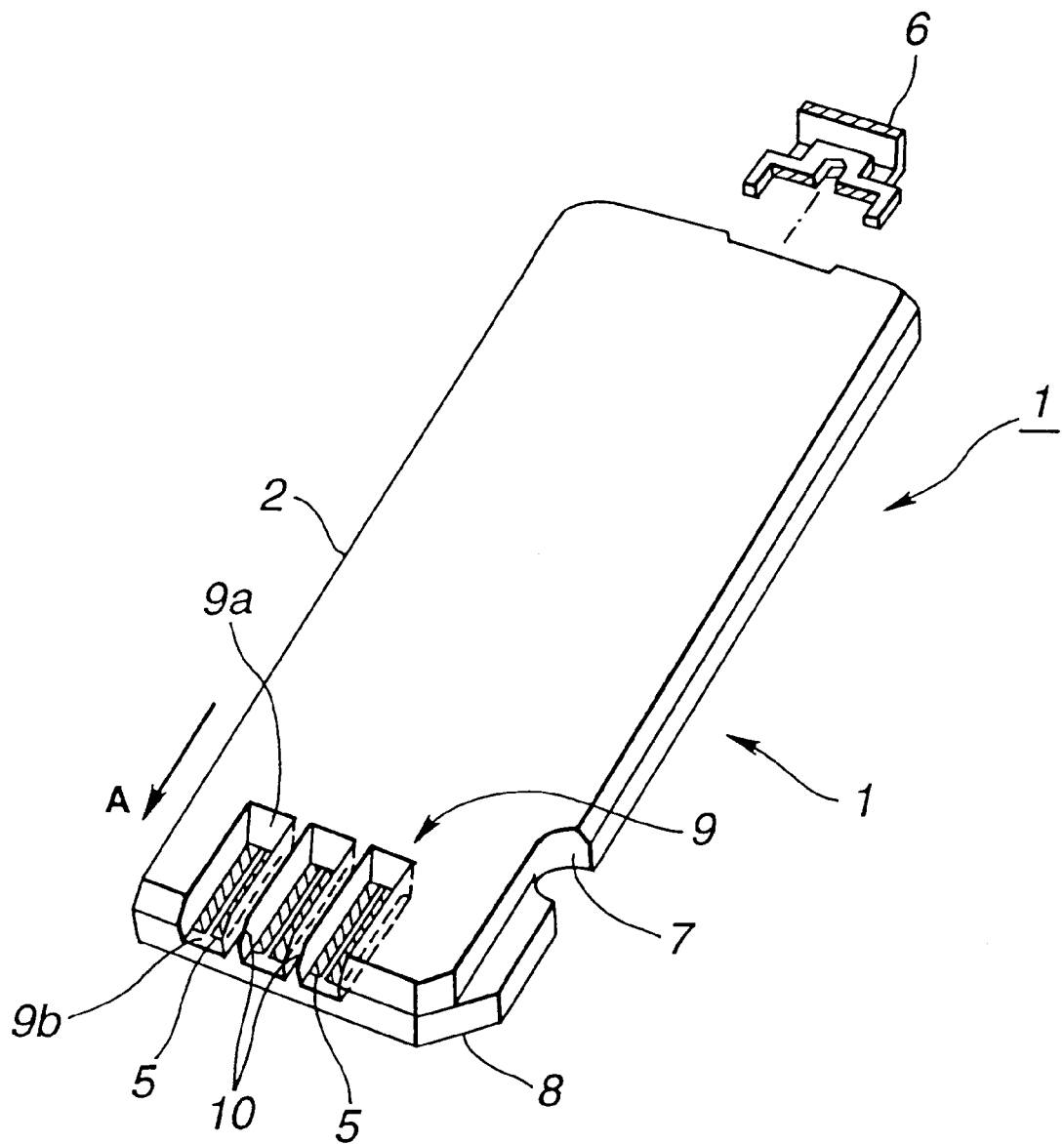
FIG. 2 is a perspective view of the memory card in FIG. 1A.

Further, the memory card 1 has terminals 5 for connection to an external system as shown in FIG. 2. When the memory card 1 is inserted into a memory card receptacle, the terminals 4 are electrically connected to those of the memory card receptacle to supply a voltage to the controlling IC 4 and transfer information signal and various control signals between the memory card 1 and the external system. The memory card 1 adopts a serial interface and the terminals provided count nine in number.

Figure 3:
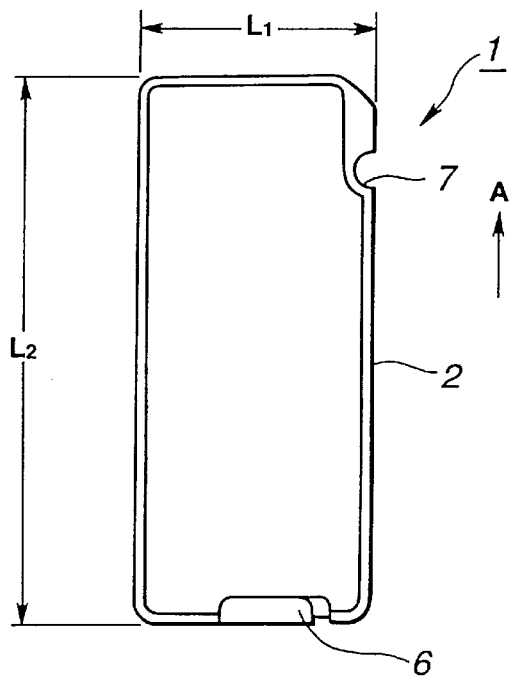
FIG. 3 is a bottom view of the memory card in FIG. 1A.

The card body 2 is a thin, flat, rectangular card made of a synthetic resin, for example. The memory card 1 of this embodiment adopts the serial interface and is designed to have nine terminals 5, and thus the card body 2 itself is small. As shown in FIG. 3, the card body 2 has a short side $L_1$ of which the length is smaller than a half of the length $L_2$ of the long side. For example, $L_1$ is 21.5 mm while $L_2$ is 50 mm, and the thickness of the card body 2 is 2.8 mm.

The card body 2 has an inadvertent erasure-preventive member 6 attached to the rear end thereof in the inserting direction of the card body 2 indicated with an arrow A in FIGS. 2 and 3. The inadvertent erasure-preventive member 6 is engaged on an inadvertent erasure-preventive switch (not illustrated) housed in the card body 2. Sliding the member 6 in a direction perpendicular to the inserting direction of the card body 2 will turn on/off the inadvertent erasure-preventive switch. Also, the card body 2 has formed on a lateral side thereof parallel to the inserting direction of the card body 2 an arcuate locking cut 7 which prevents the memory card 1 from being freely disengaged from the memory card receptacle once the memory card 1 is inserted in the receptacle. When the memory card 1 is inserted into the receptacle, a mating locking projection (not illustrated) provided on the receptacle is engaged in this locking cut 7 to prevent the memory card 1 from being freely disengaged from the receptacle.

At one lateral end in the inserting direction, the card body 2 is cut (at 8) obliquely with respect to the inserting direction of the card body 2. This cut 8 is formed to prevent the memory card 1 from being incorrectly inserted into the receptacle. Further, the card body 2 has formed a concavity 9 formed at the forward end, in the inserting direction, thereof.

The concavity 9 is formed open to the forward end of the card body 2 and extends longitudinally from the forward end, in the inserting direction, of the card body 2. The concavity 9 is deep a predetermined step from the top surface of the card body 2, and thus it is defined by three walls and a bottom 9b. One 9a of the walls of the concavity 9, inner and parallel to the forward open end, is inclined at a predetermined angle with respect to the bottom 9b.

Because of the forward open end and inclined inner wall 9a of the concavity 9 in the memory card 1, dust or the like in the concavity 9 can be easily let out when the memory card 1 is inserted into the receptacle.

In the concavity 9, there is disposed a plurality of terminals 5 for connection to corresponding terminals of the receptacle when the card body 2 is inserted into the receptacle. The terminals 5 are formed by punching a thin metal sheet or from a pattern of a printed wiring board. They are laid side by side on the bottom 9b of the concavity 9 in the inserting direction of the card body 2, and exposed to outside.

Since the memory card 1 of the present invention adopts the serial interface, the terminals 5 thus provided count nine in number. Namely, the nine terminals 5 disposed in the concavity 9 of the memory card 1 include a digital signal input/output terminal, a sync signal input terminal, a status signal input terminal four voltage supply terminals, and two reserved terminals.

Further, there are formed between the terminals 5 inside the concavity 9 projections 10 serving to prevent an access or touch to the terminals 5 from outside. As shown in FIG. 2, for example, the projections 10 extend between the open forward end and the inner wall 9a of the concavity 9 parallel to the forward end, and count two in number to trisect the space in the concavity 9 in this case. Three terminals 5 are disposed in three sockets, respectively, defined by the projections 10 thus formed inside the concavity 9.

The projections 10 provided in the concavity 9 of the memory card 1 will prevent the user from inadvertently touching the terminals 5 when inserting the memory card 1 into the receptacle. The terminals 5 can be thus protected.

The central one of the terminals 5 disposed in the three sockets defined by the projections 10 in the concavity 9 should desirably be connected to the ground potential.

Since the memory card 1 is connected at the central one of the terminals 5 to the ground potential, even when the user's finger is put into the concavity 9, it will touch the grounded one of the terminals 5 so that a static electricity, if any, caused by touching the terminals 5 with the finger will be connected to the earth and thus the memory chip 3 will not be damaged by the static electricity.

Figure 4:
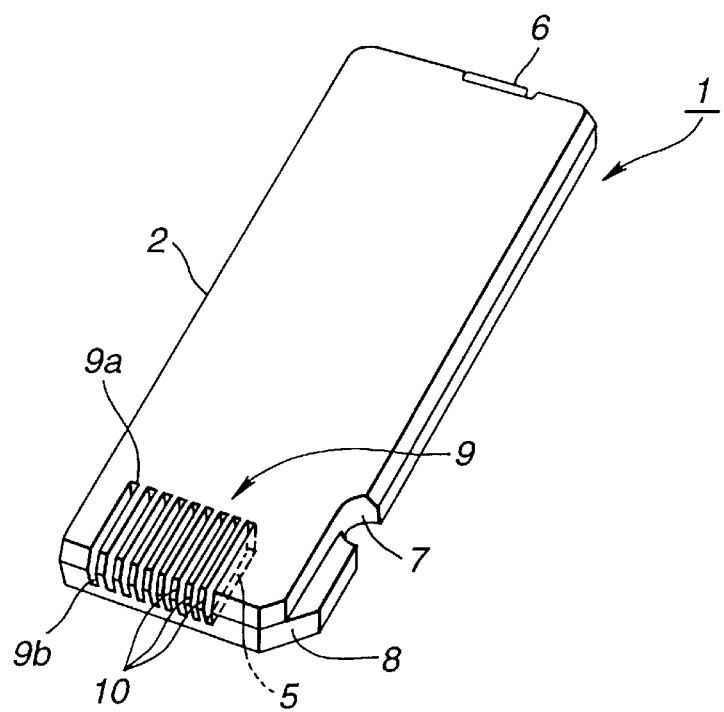
FIG. 4 is a perspective view of a third embodiment of the memory card according to the present invention.

As show in FIG. 4, the memory card 1 may have formed in the concavity 9 a corresponding number of the projections 10 to a desired number of the terminals 5, and have the terminals 5 disposed in the sockets, respectively, defined by the projections 10 in the concavity 9. The projections 10 thus formed for the terminals 5 will positively prevent the terminals 5 being accessed or touched from outside.

It should be noted that ten terminals 10 may be provided in the memory card 1 as shown in FIG. 1B. Three of these ten terminals 5 may be reserved ones. In the memory card 1 with such ten reserved terminals 5, the three reserved terminals 5 can be used as signal input or output terminals to permit a parallel interface using a total of four signal input or output terminals including the aforementioned digital signal input/output terminal.

Figure 5A:
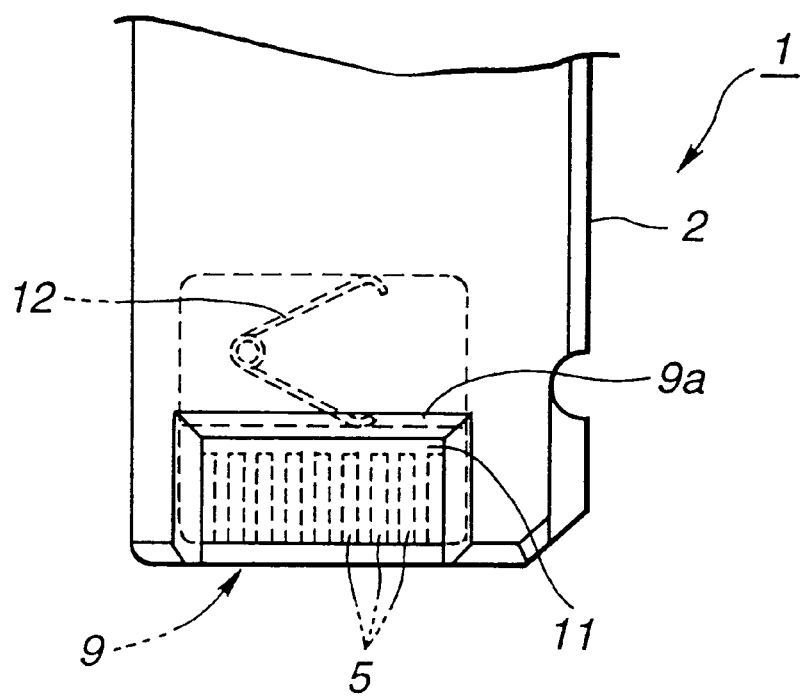
FIG. 5A is a plan view of a fourth embodiment of the memory card according to the present invention, showing the essential portion thereof with a shutter member placed to close or cover the concavity.

The present invention has been described in the foregoing concerning an embodiment in which the projections 10 are formed in the concavity to prevent access or touch to the terminals 5. However, the memory card 1 according to the present invention may comprise a shutter member 11 which is moved to open or close the concavity 9. As shown in FIG. 5A, when the memory card 1 is not inserted in the receptacle, the shutter member 11 closes the concavity 9 to prevent access to the terminals 5. In this embodiment, the card body 2 has formed therein, over an axial distance substantially corresponding to the axial length of the concavity 9 from the inner wall 9a parallel to the forward end of the concavity 9, an indentation in which the shutter member 11 is slidable.

The shutter member 11 is a rectangular plate made of a synthetic resin, for example, and slightly larger in area than the top opening of the concavity 9, and it is installed at the forward end of the card body 2 to be movable in the inserting direction. While the memory card 1 is not inserted in the receptacle, the shutter member 11 is pressed to the forward end of the concavity 9 to cover the top opening of the concavity 9.

Figure 5B:
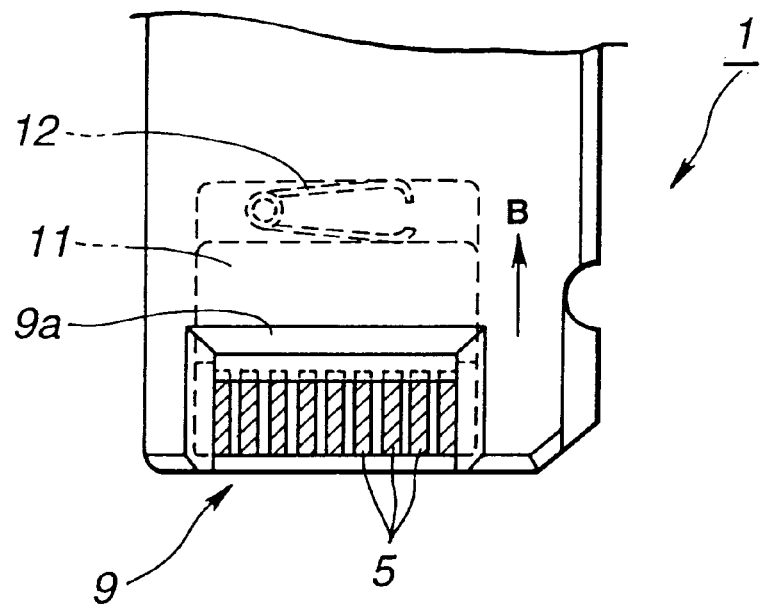
FIG. 5B is a plan view of the memory card in FIG. 5A, showing the essential portion thereof with the shutter member placed to open the concavity.

When the memory card 1 is inserted into the receptacle, it will abut at the forward end thereof on projections of the receptacle as will be further described later. As shown in FIG. 5B, as the memory card 1 is inserted, the shutter member 11 is pushed in by the projections against the force of a spring member 12 in the direction of arrow B, and moved into the above-mentioned indentation so that the concavity 9 will be open at the top thereof.

When the memory card 1 is not inserted into the receptacle, the concavity 9 is covered by the shutter member 11, so that the terminals 5 are prevented from being accessed or touched from outside and thus protected.

In the memory card 1 according to this embodiment as well, the inner wall 9a parallel to the ward open end of the concavity 9 is inclined at a predetermined angle with respect to the bottom 9b. Also the shutter member 11 should desirably have an inclined forward end face.

The memory card 1 has thus the inclined inner wall 9a parallel to the forward open end of the concavity 9 and the inclined forward end face of the shutter member 11 so that when the memory card 1 is inserted into the receptacle, dust or the like in the concavity 9 can easily be let out from on the inclined wall and end face.

Figure 6A:
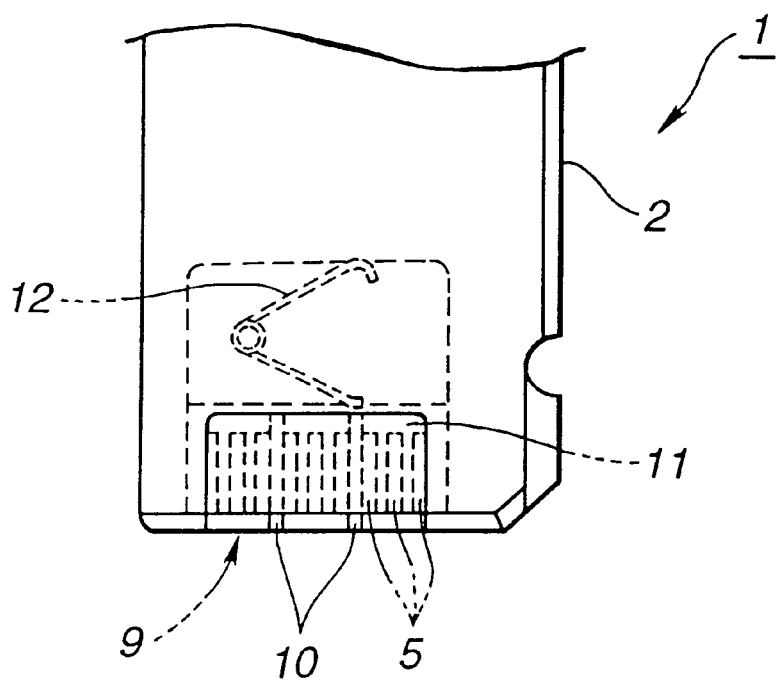
FIG. 6A is a plan view of a fifth embodiment of the memory card according to the present invention, showing the essential portion thereof with a shutter member placed to close the concavity.
Figure 6B:
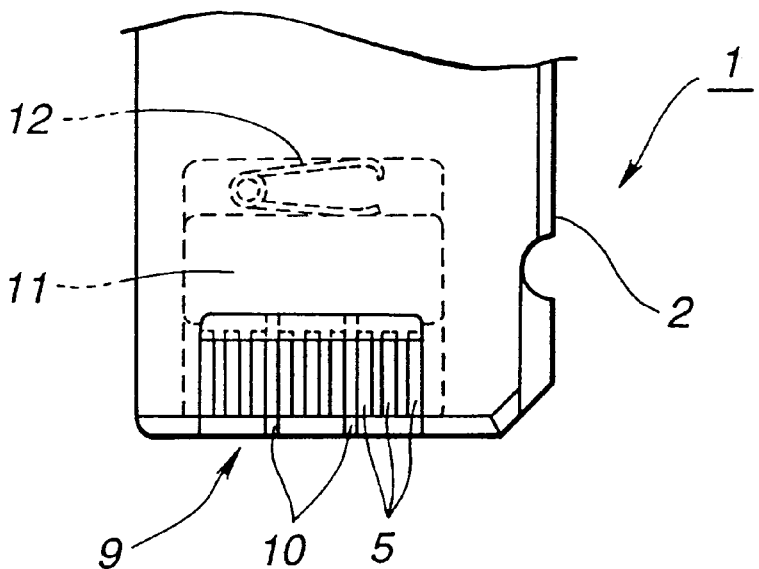
FIG. 6B is a plan view of the memory card in FIG. 6A, showing the essential portion thereof with the shutter member placed to open the concavity.

Also in this memory card 1, the projections 10 may be formed inside the concavity 9 to define sockets for the terminals 5 as shown in FIGS. 6A and 6B. Thus, the projections 10 can positively protect the terminals 5 by preventing touch to them even when the shutter member 11 is inadvertently opened with the memory card 1 not yet inserted into the receptacle. FIG. 6A shows the top opening of the concavity 9 being covered or closed by the shutter member 11 while FIG. 6B shows the shutter member 11 moved away from on the concavity 9 and thus the concavity 9 being open at the top thereof.

Figure 7:
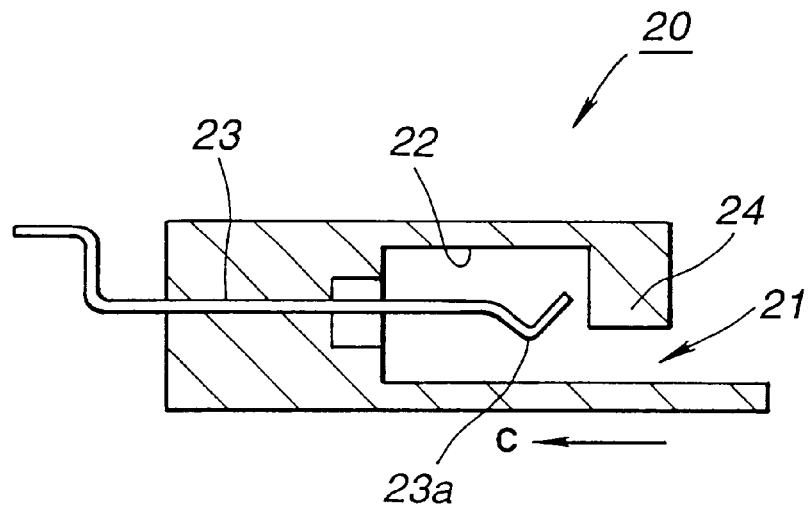
FIG. 7 is a sectional view of a first embodiment of the memory card receptacle according to the present invention.
Figure 8:
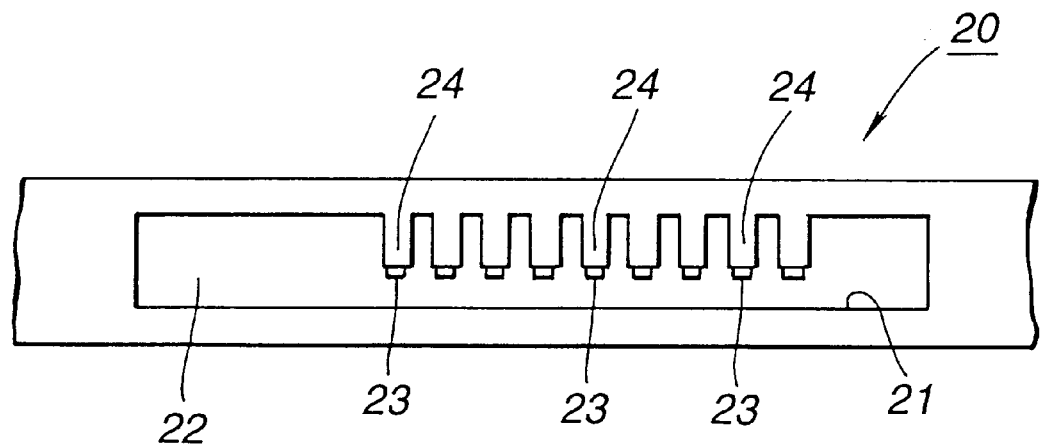
FIG. 8 is a front view of the memory card receptacle in FIG. 7.

FIGS. 7 and 8 show a memory card receptacle, generally indicated with a reference 20, adapted to receive the memory card 1 having been described in the foregoing. When the memory card 1 constructed as in the above is used, it is inserted in th receptacle 20 as shown in FIGS. 7 and 8 to record or reproduce information signal into or from the memory card 1.

As shown, the memory card receptacle 20 has an opening 21 formed at the front end thereof, through which the memory card 1 is inserted into the receptacle 20. Also, the receptacle 20 has formed therein, in the inserting direction of the memory card 1 indicated with an arrow C in FIG. 7, a memory card receiving concavity 22 axially extending from the opening 21 to a depth in the receptacle 20 and in which the memory card 1 is received. There are disposed inside this memory card receiving concavity 22 tips of a plurality of terminals 23 electrically connected to an external system as shown in FIG. 7.

The terminals tips 23 are formed by punching a thin metal sheet, for example. The terminals 23 are supported with the bases thereof buried in the body of the receptacle 20 as shown. Therefore, the terminals 23 also work as leaf springs which depress the terminals 5 of the memory card 1 inserted in the receptacle 20. The terminals 23 have each a contact point 23a formed near the free ends thereof inside the receiving concavity 22 and which are put into contact with the terminals 5 of the memory card 1.

The terminals 23 of the receptacle 20 are equal in number to the terminals 5 of the memory card 1. In this embodiment of the receptacle 20, nine terminals 23 for the nine terminals 5 of the memory card 1 are provided in the receiving concavity 22.

Figure 9:
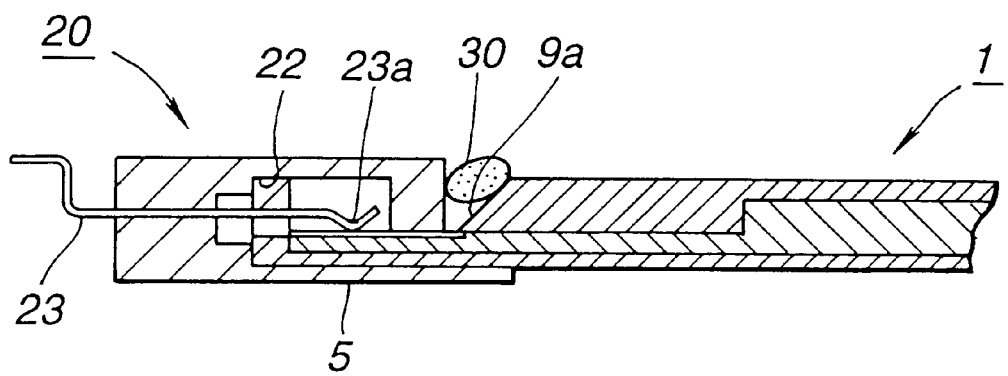
FIG. 9 is a sectional view of the receptacle in FIG. 7 in which the memory card is received.

Further, there are provided ahead of the terminals 23 disposed in the receiving concavity 22, that is to say, in positions corresponding to the forward end of the memory card 1 when inserted in the receptacle 20, projections 24 which will slide on the terminals 5 of the memory card 1 when the latter is inserted into the receptacle 20. The projections 24 are equal in number to the terminals 5 of the memory card 1 similarly to the terminals 23 of the receptacle 20. The projections 24 are provided ahead of the terminals 23. In this embodiment of the receptacle 20, nine projections 24 are thus provided for the nine terminals 5. When the memory card 1 is inserted into the receptacle 20, the projections 24 slide on the terminals 5 of the memory card 1 before they get into contact with the terminals 23 as shown in FIG. 9. The projections 24 will let out dust or the like from inside the concavity 9 of the memory card 1 over the inclined wall 9a of the concavity 9 of the memory card 1.

When the memory card 1 is inserted into the memory card receptacle 20, the projections 24 move ahead of the terminals 23 and slide on the terminals 5 of the memory card 1. After the projections 24 let out dust or the like from on the terminals 5, the terminals 23 get into contact with the terminals 5 of the memory card 1. Thus, the terminals 23 and 5 are electrically connected to one another in a positive manner.

In the receptacle 20, the plurality of projections 24 is provided ahead of the terminals 23 correspondingly to the terminals 5, respectively, of the memory card 1 in such a manner that the projections 24 can be well fitted into the sockets defined by the projections 10 inside the concavity 9 of the memory card 1 for the respective terminals 5. Thus, the receptacle 20 can suitably receive the memory card 1 of such a structure as well as the memory card 1 having the concavity 9 of which the space is similarly trisected by the projections 10.

Figure 10:
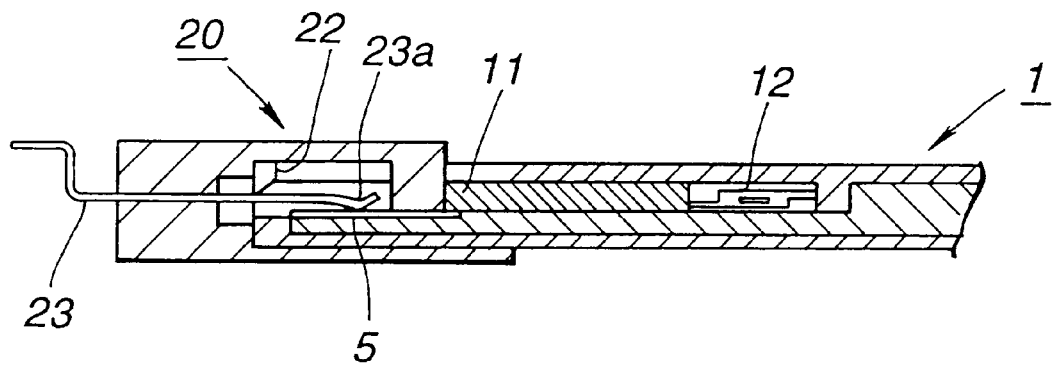
FIG. 10 is a sectional view of the receptacle in FIG. 7 in which another memory card of the present invention is received.

Further, the receptacle 20 can well receive the memory card 1 having the concavity 9 of which the top opening can be covered by the shutter member 11 for protection of the terminals 5. In this example, when the memory card 1 having the shutter member 11 is inserted into the receptacle 20, the projections 24 abut at the front end faces thereof on the forward end of the shutter member 11 which will thus be moved open as the memory card 1 is further inserted into the receptacle 20, as seen from FIG. 10.

Figure 11:
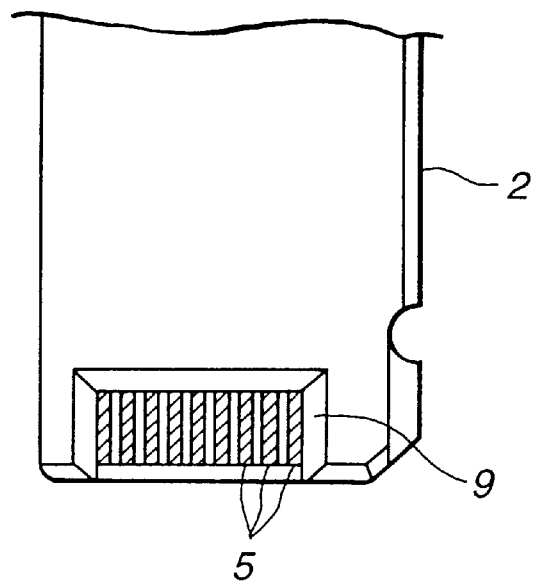
FIG. 11 is a plan view showing the essential portion of another memory card of the present invention.

Also it is of course that the receptacle 20 can receive a memory card having only the concavity 9 formed at the forward end, in the inserting direction, of the card body 2, and the terminals 5 disposed in the concavity 9, as shown in FIG. 11, with the projections 10 and shutter member 11 not provided.

The memory card receptacle 20 is versatile as having been described in the above, namely, it can be universally applied without being restricted by the shape of the memory card 1.

Figure 12:
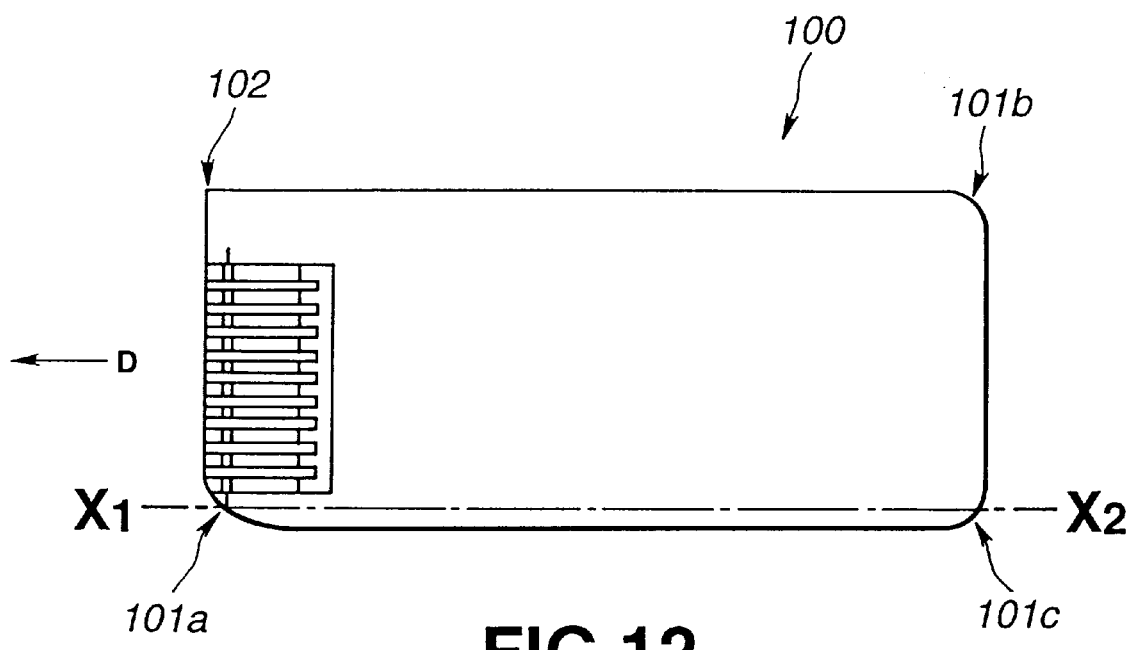
FIG. 12 is a plan view showing an example of the shape of the memory card of the present invention.
Figure 13:
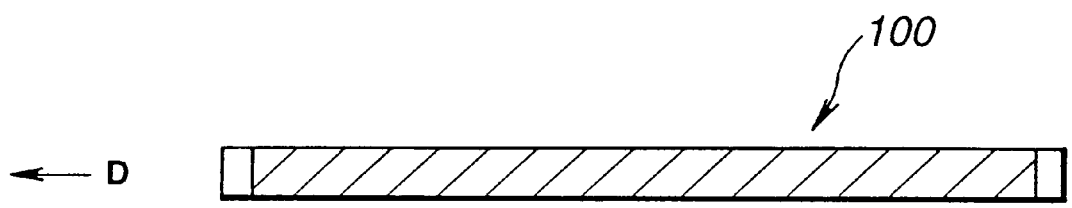
FIG. 13 is a sectional view taken along the line $X_1$–$X_2$ of the memory card in FIG. 12.

It should now be noted that the memory card according to the present invention may also be constructed as will be discussed below:

FIG. 12 is a plan view of an example of the memory card, and FIG. 13 is a sectional view taken along the line $X_1$–$X_2$ of the memory card in FIG. 12.

The memory card is generally indicated with a reference 100. It has a generally rectangular flat shape having four corners 101a, 101b, 101×c and 102. Of these four corners, one (101a) of the corners at the forward end, in the inserting direction, of the memory card 100 indicated with the arrow D, and both the corners 101b and 101c at the rear end, in the inserting direction of, the memory card 100 indicated with the arrow D, are chamfered much more than the remaining corner, or the latter is not chamfered. Namely, the memory card 100 is so shaped that it can be judged based on the position of the corner 102 whether the memory card 100 being inserted into the receptacle is positioned correctly or incorrectly, whereby the memory card 100 can be prevented from incorrectly being inserted into the receptacle.

As mentioned above, the remaining corner 102 at the forward end, in the inserting direction, of the memory card 100 indicated with the arrow D is not chamfered while the other three corners 101a, 101b and 101c are chamfered to have an arcuate form, for example. Furthermore, the corner 101a is rounded much more than the other two corners 101b and 101c as shown in FIG. 12.

Figure 14:
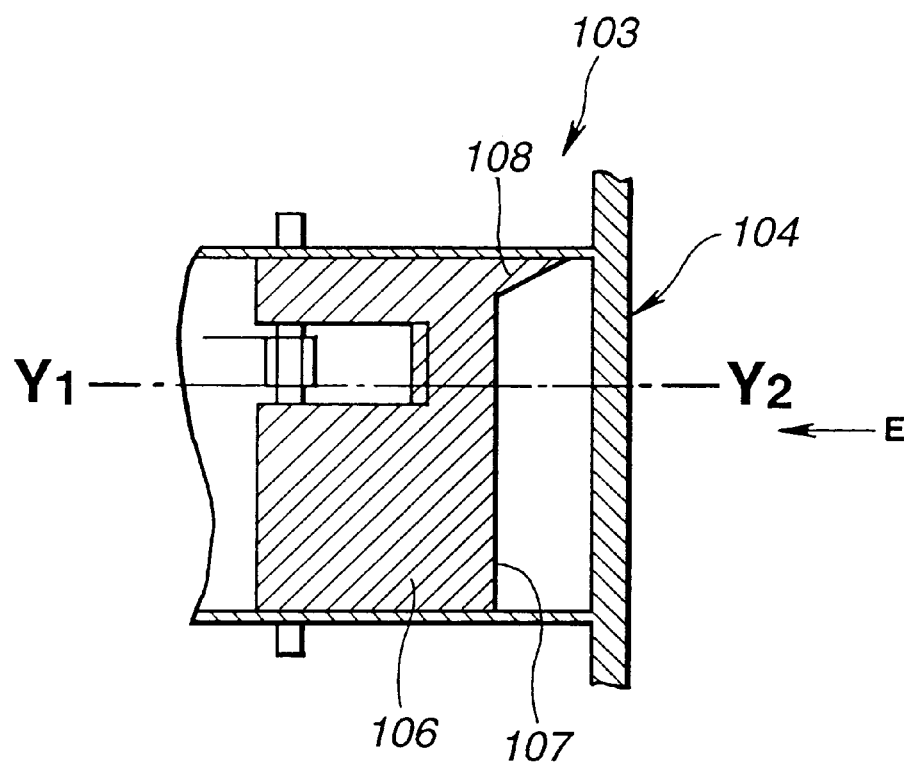
FIG. 14 is a plan view showing an example of the construction of the receptacle of the present invention in which the memory card of the present invention is received.
Figure 15:
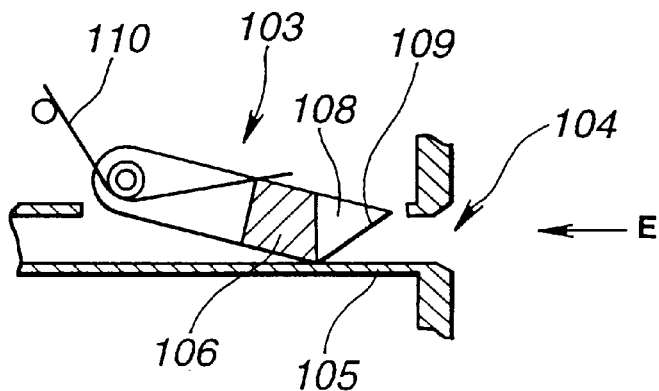
FIG. 15 is a sectional view taken along the line $Y_1$–$Y_2$ in FIG. 14, showing the example of the construction of the receptacle of the present invention.

When used for information recording or reproduction, the memory card 100 is inserted into a receptacle 103 as shown in FIGS. 14 and 15. FIG. 14 is a plan view of an example of the receptacle 103, and FIG. 15 is a sectional view taken along the line $Y_1$–$Y_2$ of the receptacle 103 in FIG. 14. Although FIG. 14 is a plan view, hatching is made somewhere therein for better understanding of the relation between the members of the receptacle 103.

The receptacle 103 has formed at the forward-end thereof an opening 104 through which the memory card 100 is to be inserted, formed therein a receiving concavity 105 extending from the opening 104 along the inserting direction of the memory card 100 indicated with an arrow E, and provided at the innermost portion of the opening 104 an incorrect insertion-preventive member 106 extending in the inserting direction of the memory card 100 indicated with the arrow E.

The incorrect insertion-preventive member 106 has at the opening 104 of the receptacle 103 a front end face 107 extending generally perpendicular to the inserting direction of the memory card 100, and a projection 108 formed at one of the lateral ends of the front end face 107. The projection 108 has an oblique surface 109 which becomes thinner and narrower as it goes from the front end face 107 toward the opening 104. The oblique surface 109 detects the corner 102 of the memory card 100.

Further the incorrect insertion-preventive member 106 is pivoted and forced clockwise in the plane of FIG. 15 under the action of a coil spring 110. When the receptacle 103 is not used, the member 106 closes the opening 104 to block dust or the like from coming into the receptacle 103.

Figure 16:
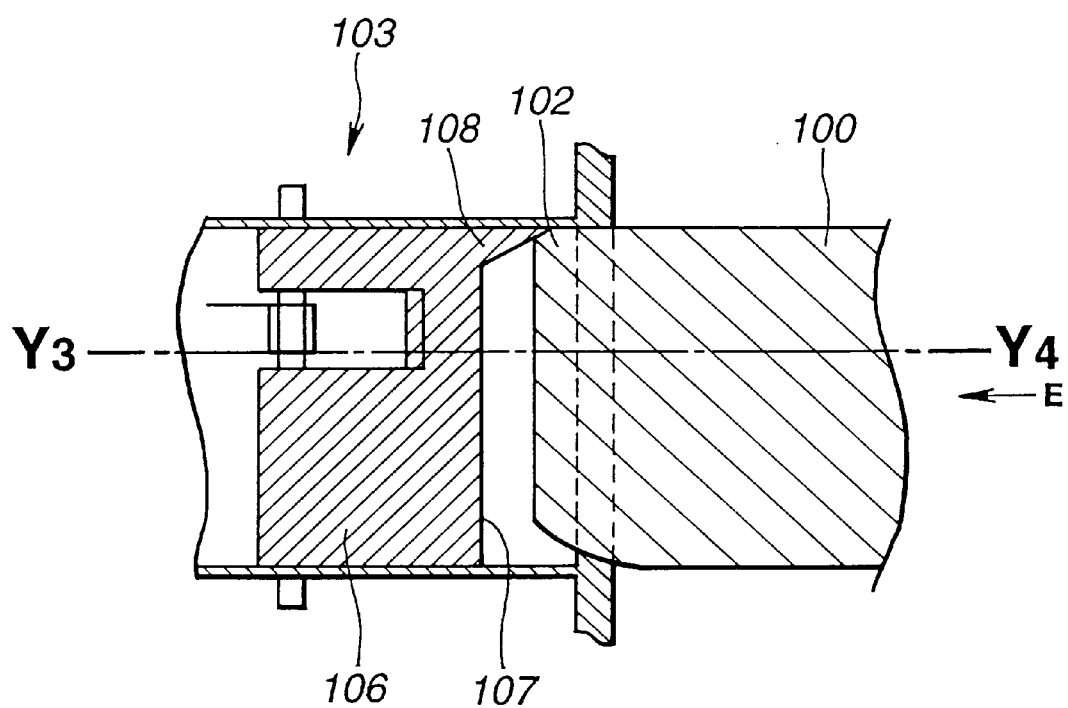
FIG. 16 is a plan view showing the memory card being correctly inserted in the receptacle.
Figure 17:
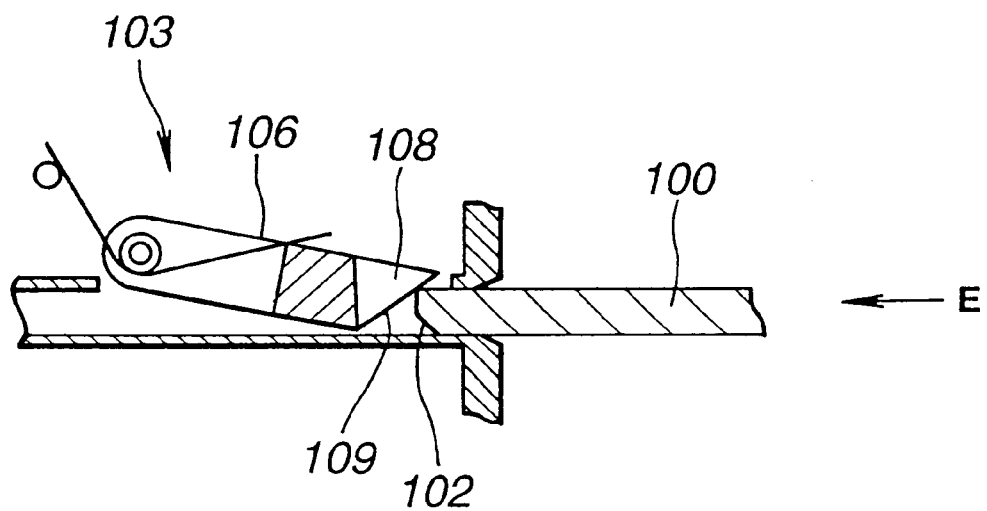
FIG. 17 is a sectional view taken along the line $Y_3$–$Y_4$ in FIG. 16, showing the memory card being correctly inserted in the receptacle.
Figure 18:
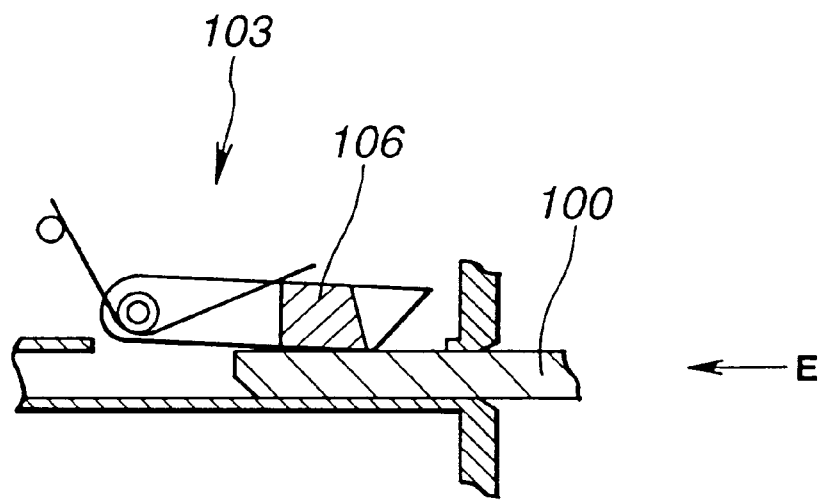
FIG. 18 is also a sectional view taken along the line $Y_3$–$Y_4$ in FIG. 16, showing the memory card correctly inserted in the receptacle.

FIGS. 16, 17 and 18 show the memory card 100 correctly inserted in the receptacle 103. As the memory card 100 is inserted from the opening 104 in the direction of arrow E, it will abut at the corner 102 thereof on the projection 108 formed on the incorrect insertion-preventive member 106 as shown in FIG. 16. Then the upper end of the corner 102 slides on the oblique surface 109 of the projection 108 as shown in FIG. 17 and urges up the incorrect insertion-preventive member 106. Eventually the corner 102 will allow the incorrect insertion-preventive member 106 to escape as shown in FIG. 18 and thus the memory card 100 is allowed to go into place in the receptacles 103.

Figure 19:
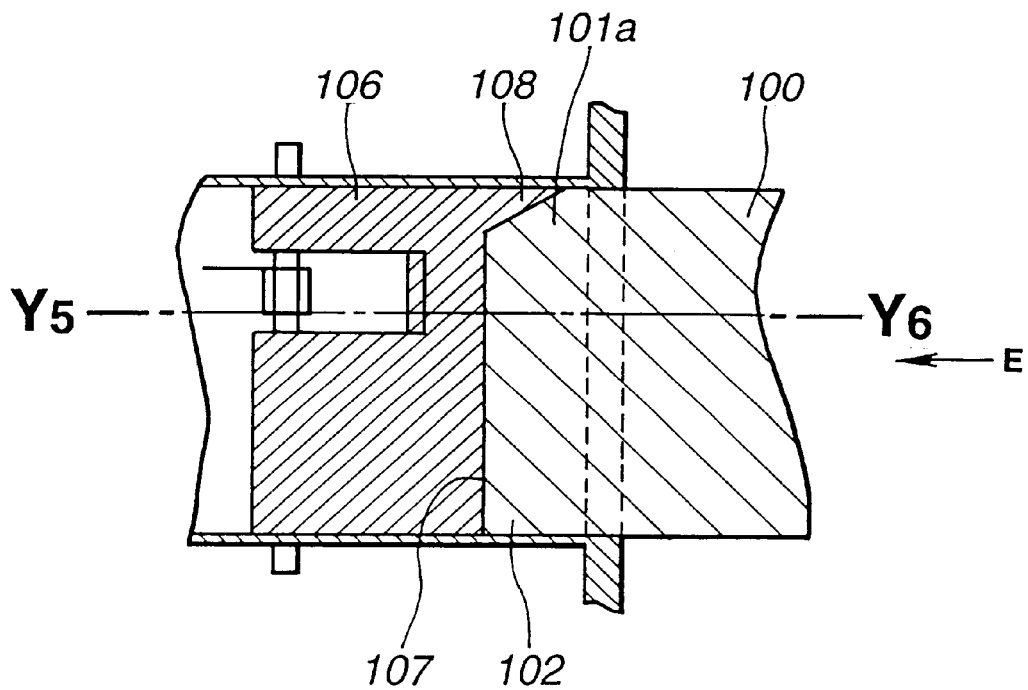
FIG. 19 is a plan view showing the memory card being incorrectly inserted into the receptacle.
Figure 20:
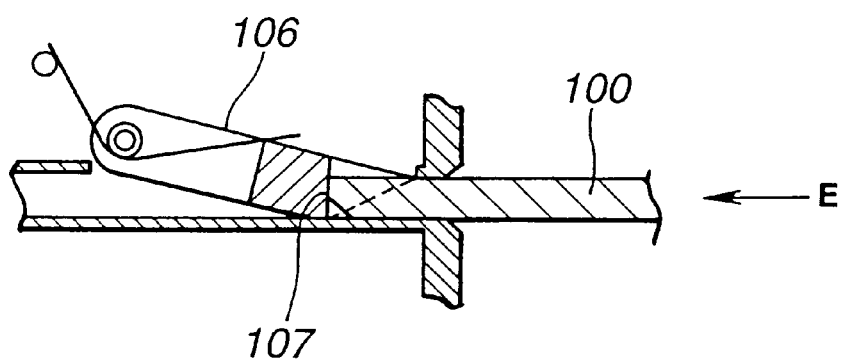
FIG. 20 is a sectional view taken along the line $Y_5$–$Y_6$ in FIG. 19, showing the memory card being incorrectly inserted into the receptacle.

FIGS. 19 and 20 show the memory card 100 being inserted in a wrong direction into the receptacle 103. As the memory card 100 is inserted in the direction of arrow E, the rounded corner 101a will not abut on the projection 108 of the incorrect insertion-preventive member 106 but at the forward end, in the inserting direction, thereof on the front end face 107 of the incorrect insertion-preventive member 106. Since the front end face 107 of the member 106 is formed generally perpendicular to the inserting direction of the memory card 100 indicated with the arrow E, the forward end of the memory card 100 will be caught by the projection 108 and thus cannot urge up the incorrect insertion-preventive member 106. Therefore, if the memory card 100 is incorrectly inserted into the receptacle 103, the corner 101a will not allow the incorrect insertion-preventive member 106 to escape, so that the memory card 100 cannot be inserted deep into place in the receptacle 103.

FIGS. 19 and 20 show an example in which the memory card 100 is inserted upside down in the receptacle 103. Also in this case, the corners 101b and 101c will not allow the incorrect insertion-preventive member 106 to escape, so that the memory card 100 cannot be inserted deep into place in the receptacle 103. Therefore, it is only when the memory card 100 is inserted correctly that the memory card 100 can be inserted deep into place in the receptacle 103. Thus, the memory card 100 can be prevented from being incorrectly inserted into the receptacle 103.

Figure 21:
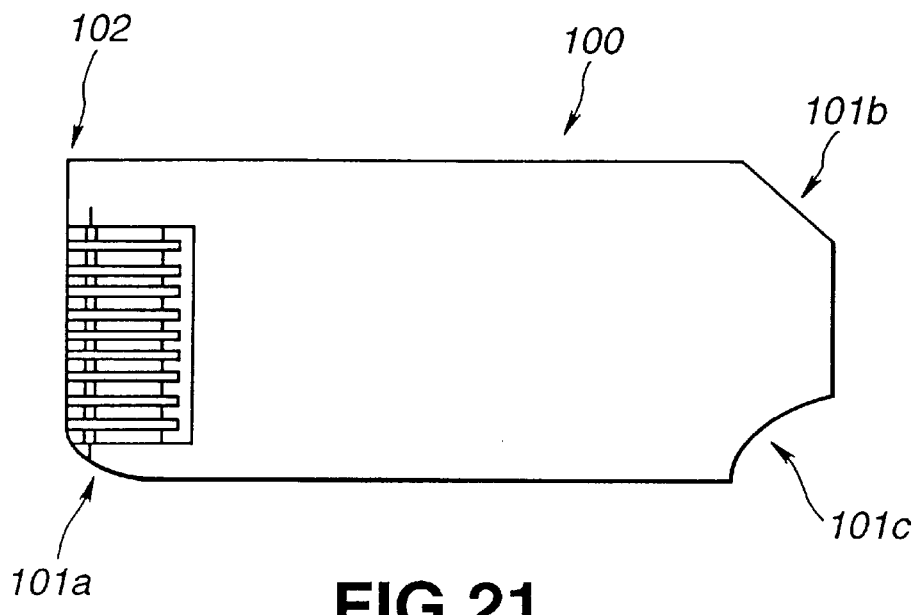
FIG. 21 is a plan view showing an example of the shape of the memory card of the present invention.

For the purpose of preventing an incorrect insertion of the memory card 100, the corners 101a, 101b and 101c have only to be formed not to abut on the projection 108 of the incorrect insertion-preventive member 106, and thus may be shaped to have any flat form. For example, the corners may be chamfered in different sizes as well as in various shapes such as arcuate, linear or the like as shown in FIG. 21. Such variations in chamfered size and shape of the corners will also give a variation to the memory card design.

Figure 22:
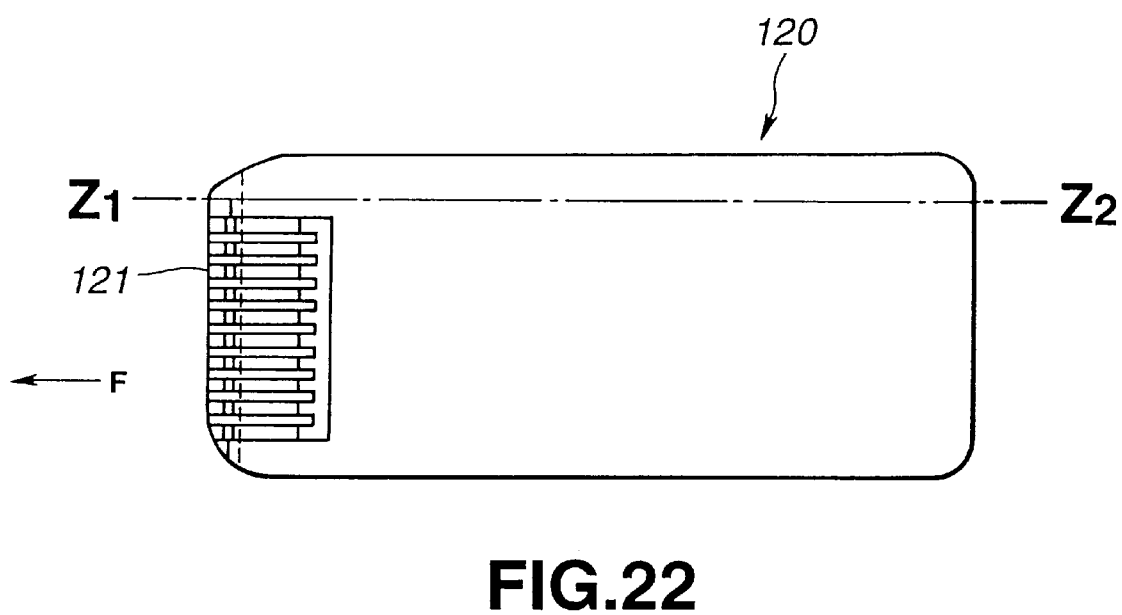
FIG. 22 is a plan view showing an example of the shape of the memory card of the present invention.
Figure 23:
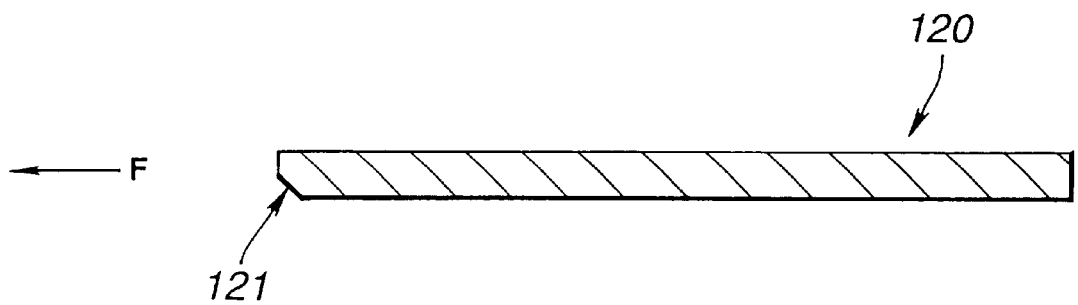
FIG. 23 is a sectional view of the memory card, taken along the line $Z_1$–$Z_2$ in FIG. 22.

Also it should be noted that the memory card according to the present invention may be constructed as will be discussed below:

FIG. 22 shows, in the form of a plan view, an example of the memory card, and FIG. 23 is a sectional view taken along the line $Z_1$–$Z_2$ of the memory card shown in FIG. 22.

This memory card 120 is generally rectangular in shape, and cut at 121 at the bottom edge of the forward end thereof in the inserting direction indicated with an arrow F as will be seen from FIG. 23. The cut 121 extends over the entire forward-end short side of the memory card 120, and provides an oblique flat end face.

For preventing incorrect insertion of the memory card 120, it is judged based on the position of this cut 121 whether the memory card 120 is inserted correctly or incorrectly, as will be discussed below.

Figure 24:
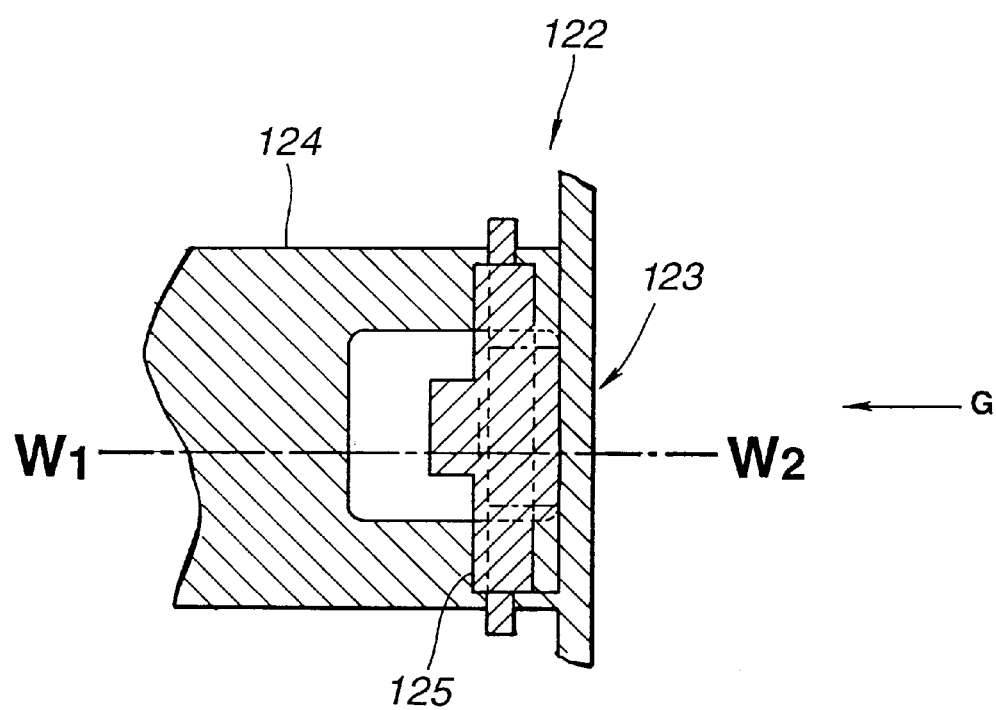
FIG. 24 is a plan view showing an example of the construction of the receptacle of the present invention in which the memory card of the present invention is inserted.
Figure 25:
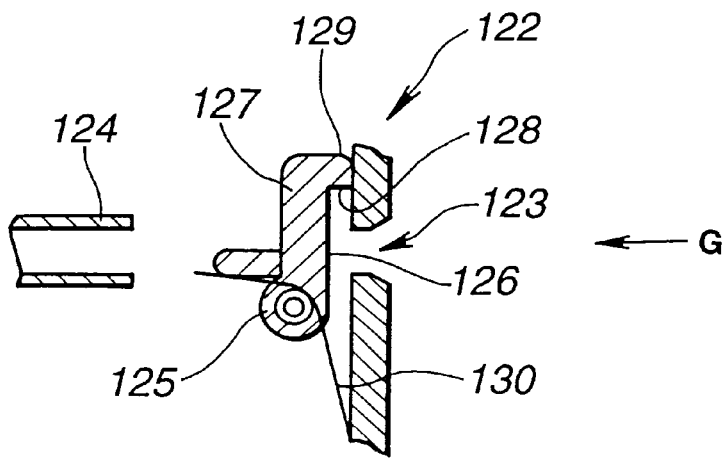
FIG. 25 is a sectional view of the receptacle, taken along the line $W_1$–$W_2$ in FIG. 24.

For information recording or reproduction, the memory card 120 is inserted into place in a receptacle 122 as shown in FIGS. 24 and 25. FIG. 24 is a plan view of an example of the construction of the receptacle 122, and FIG. 25 is a sectional view taken along the line $W_1$–$W_2$ of the receptacle 122 shown in FIG. 24. The receptacle 122 has formed at the forward end thereof an opening 123 through which the memory card 120 is to be inserted, formed therein a receiving concavity 124 extending from the opening 123 in the inserting direction of the memory card 120 indicated with an arrow G, and provided at the innermost portion of the opening 123 an incorrect insertion-preventive member 125 extending in the inserting direction of the memory card 120 indicated with the arrow G.

As shown in FIG. 25, the incorrect insertion-preventive member 125 has a blocking plate 127 having a first face 126 generally perpendicular to the inserting direction of the memory card 120 indicated with the arrow G, and a projection 129 provided at the upper end of the blocking plate 127 on the side of the opening 123 and which has a second face 128 generally parallel to the inserting direction of the memory card 120.

Further the incorrect insertion-preventive member 125 is pivoted and forced clockwise in the plane of FIG. 25 under the action of a coil spring 130. When the receptacle 122 is not used, the member 125 closes the opening 123 to block dust or the like from coming into the receptacle 122.

As the memory card 120 is inserted into the receptacle 122, the incorrect insertion-preventive member 125 is rotated about 90 deg. counterclockwise (in the plane of Figure) against the action of the coil spring 130 and the first face 126 will be generally parallel to the inserting direction of the memory card 120.

Figure 26:
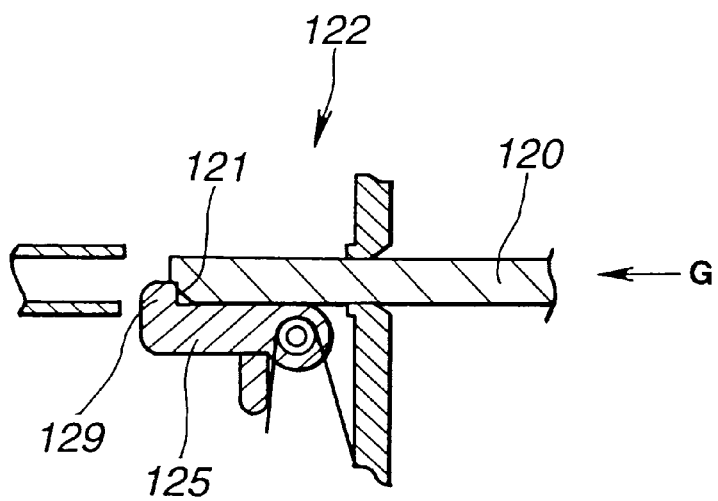
FIG. 26 is a sectional view showing the memory card being correctly inserted in the receptacle.
Figure 27:
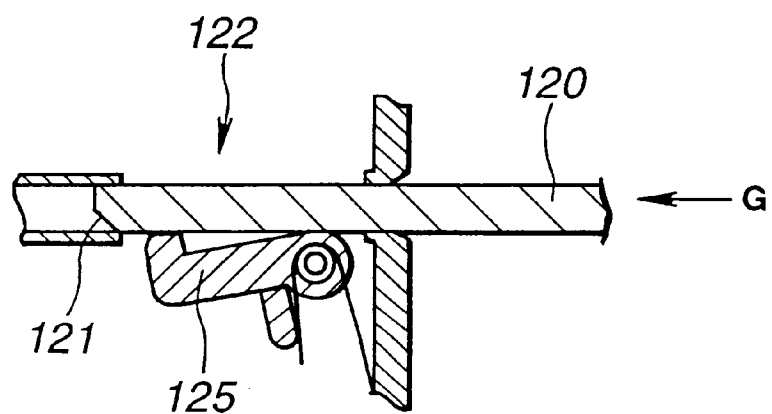
FIG. 27 is also a sectional view showing the memory card being correctly inserted in the receptacle.

When the memory card 120 is correctly inserted into the receptacle 122, that is to say, when the cut 121 formed at the bottom edge of the forward end of the memory card 120 is positioned down, the forward end of the memory card 120 will slide at the oblique face of the cut 121 onto the projection 129 to depress the incorrect insertion-preventive member 125, as shown in FIG. 26. Thus, the cut 121 will allow the incorrect insertion-preventive member 106 to escape as shown in FIG. 27 and thus the memory card 120 is allowed to go deep into place in the receptacle 122.

Figure 28:
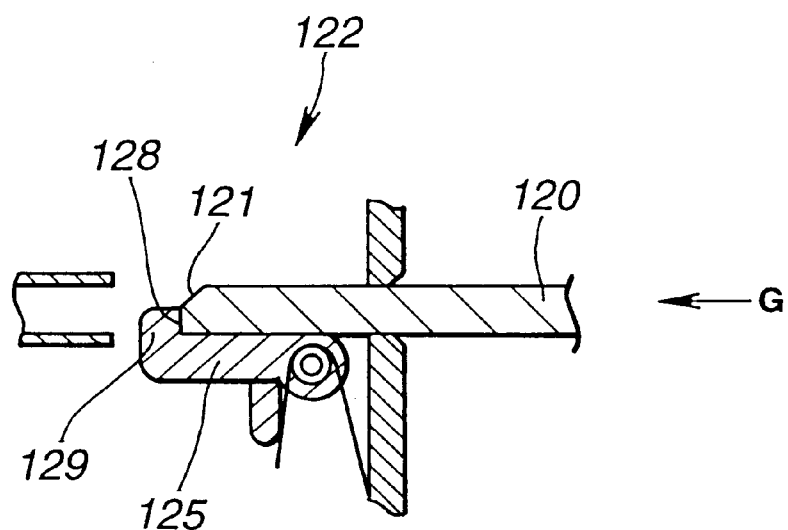
FIG. 28 is a sectional view showing the memory card being incorrectly inserted into the receptacle.

When the memory card 120 is inserted in a wrong direction into the receptacle 122, that is, when the cut 121 is not positioned down as shown in FIG. 28, the memory card 120 will abut at the forward end thereof onto the second face 128 of the projection 129. Since the second face 128 is generally perpendicular to the inserting direction of the memory card 120 indicated with the arrow G, the forward end of the memory card 120 is caught by the projection 129 so that it cannot depress the incorrect insertion-preventive member 125. Therefore, when the memory card 120 is inserted in a wrong direction, the incorrect insertion-preventive member 125 cannot be allowed to escape to insert the memory card 120 deep into place in the receptacle 122.

FIG. 28 shows the memory card 120 being inserted upside down into the receptacle 122. Also when the memory card 120 is inserted in a reverse direction, the incorrect insertion-preventive member 125 cannot be allowed to escape to insert the memory card 120 deep into place in the receptacle 122. Therefore it is only when the memory card 120 is inserted correctly that it can be inserted deep into place in the receptacle 122. Thus, it is possible to prevent incorrect insertion of the memory card 120.

Figure 29:
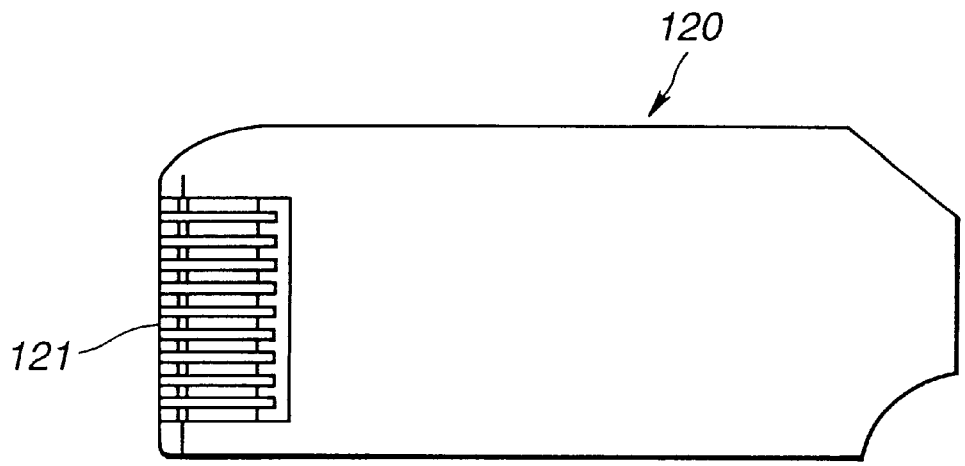
FIG. 29 is a plan view showing an example of the shape of the memory card of the present invention.

Since it is judged based on the shape in the direction of the width of the memory card 120 whether the memory card 120 is inserted correctly or incorrectly, the cut 121 has only to be formed to a size over which the projection 129 can be slid to depress the incorrect insertion-preventive member 125. Therefore, for the purpose of preventing an incorrect insertion of the memory card 120, the corners thereof has only to be shaped to have any flat form. For example, the memory card 120 may be chamfered at the corners thereof in different sizes as well as in various shapes such as arcuate, linear or the like, as shown in FIG. 29. Such variations in chamfered size and shape of the corners will also give a variation to the memory card design.

In addition to the above-mentioned structure designed for insertion into the receptacle, the memory card according to the present invention may be designed for fitting onto the top of the receptacle.

Figure 30:
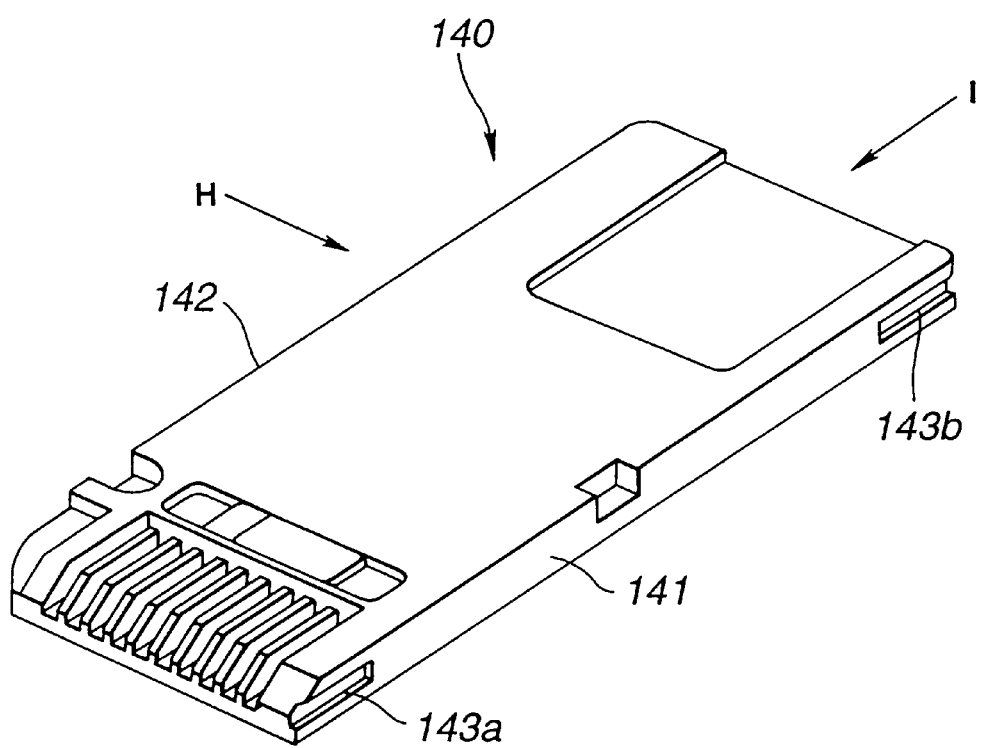
FIG. 30 is a perspective view showing an example of the shape of the memory card of the present invention.
Figure 31:
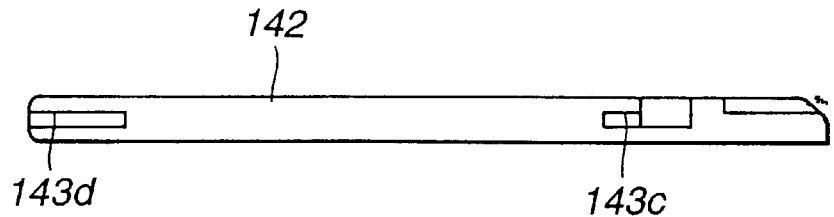
FIG. 31 is a view of the memory card from a point H in FIG. 30.
Figure 32:
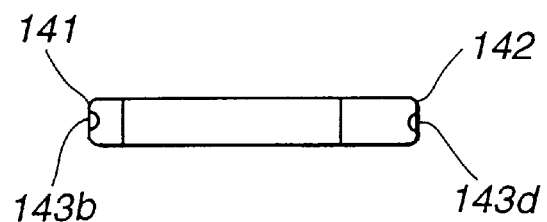
FIG. 32 is a view of the memory card from a point I in FIG. 30.

FIG. 30 shows an example of the memory card of such design. In this case, the memory card is generally indicated with a reference 140. FIG. 31 is a view of the memory card 140 from a direction H in FIG. 30, and FIG. 32 is a view of the memory card 140 from a direction I in FIG. 30. The memory card 140 has a generally rectangular flat shape. Also the memory card 140 has recesses 143a and 143b formed at end portions, respectively, of a first longitudinal side 141 thereof and also recesses 143c and 143d formed at end portions, respectively, of a second longitudinal side 142 parallel to the first longitudinal side, as shown in FIG. 31.

The memory card 140 can be fitted into a receptacle 144 using the recesses 143a to 143d thereof as will be described below.

Figure 33:
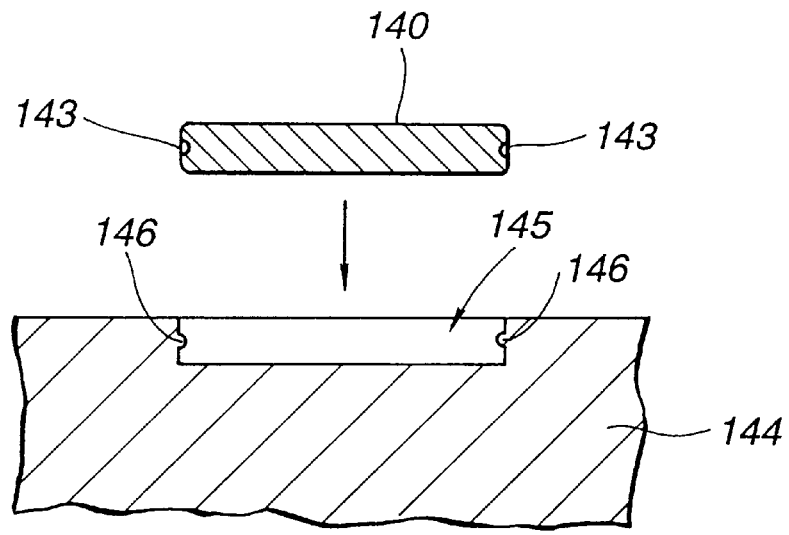
FIG. 33 is a sectional view of the memory card of the present invention inserted in the receptacle of the present invention.
Figure 34:
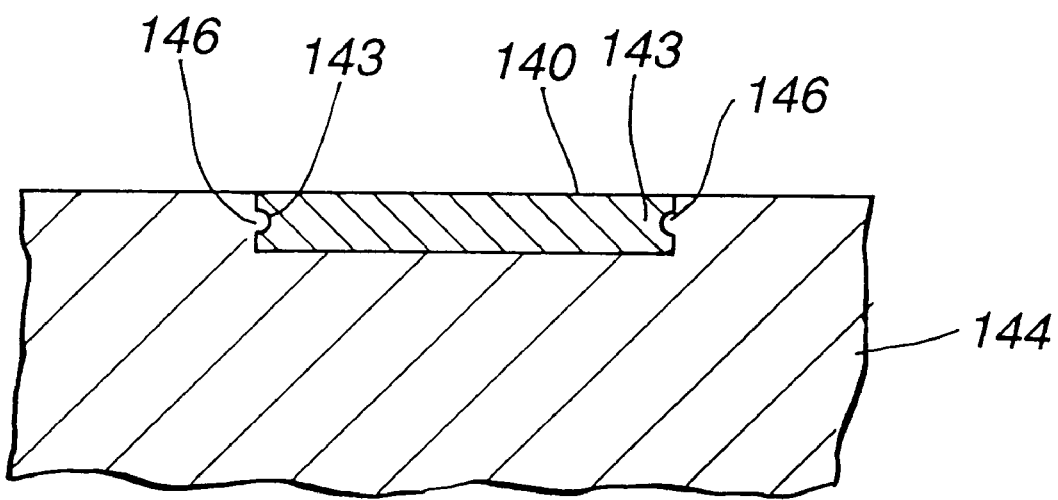
FIG. 34 is a sectional view of the memory card of the present invention inserted in the receptacle of -the present invention.

As shown in FIG. 33, the receptacle 144 has formed on the top thereof a concavity 145, for example, in which the memory card 140 is to be fitted. The concavity 145 is open at the top thereof, and projections 146 are formed on side walls, respectively, of the concavity 145. For example, the memory card 140 can be fitted to the receptacle 144 with the projections 146 of the receptacle 144 engaged in the recesses 143 (143a to 143d) of the memory card 140, as shown in FIG. 34.

The memory card 140 can be directly set in a recording/reproducing apparatus. Also, the memory card 140 may be fitted in an adapter having a shape of a flexible disk, PC card or the like, for example, and then the adapter in which the memory card 140 is fitted be set in the recording/reproducing apparatus.

In this case, since the memory card is fitted in a receptacle and then set in the recording/reproducing apparatus, the top cover of the receptacle is unnecessary and the receptacle can be designed thinner than a one which is to receive the memory card therein so that the receptacle can be designed more compact. Also, the above-mentioned adapter destined to have the memory card fitted therein for setting into a recording/reproducing apparatus can be designed to have a reduced thickness.

What is claimed is:

1. A memory card comprising:
   a substantially rectangular card body having first and second surfaces;
   electrical terminals disposed proximate an edge of said first surface and positioned in recesses that open to said first surface;
   a storage device disposed in said card body for storing data;
   a control circuit disposed in said card body for controlling writing data supplied from said terminals into said storage device and reading stored data from said storage device to said terminals; and
   said card body having four corners, three of which are of substantially the same shape and the fourth of which is of a different shape to prevent incorrect insertion of said memory card into a receptacle therefor.

2. A memory card comprising:
   a substantially rectangular card body having first and second surfaces;
   electrical terminals disposed proximate an edge of said first surface;
   a storage device disposed in said card body for storing data;
   a control circuit disposed in said card body for controlling writing data supplied from said terminals into said storage device and reading stored data from said storage device to said terminals;
   said card body having four corners, three of which are of substantially the same shape and the fourth of which is of a different shape to prevent incorrect insertion of said memory card into a receptacle therefor; and
   wherein said terminals are offset from a center line of said rectangular shape toward a first longitudinal edge of said card body and said fourth corner is provided along a second, opposite longitudinal edge of said card body.

3. The memory card of claim 1, wherein said terminals comprise an array of terminals including a ground terminal, a voltage supply terminal, a status terminal, a digital input/output terminal and a clock terminal.

4. The memory card of claim 3, wherein two of said terminals disposed at opposite ends of said array are ground terminals.

5. The memory card of claim 3, wherein said terminals further include an insertion terminal for indicating when said memory card is inserted into and removed from a receptacle therefor.

6. The memory card of claim 5, wherein said insertion terminal is located substantially at a center of said array.

7. The memory card of claim 5, wherein two of said terminals disposed at opposite ends of said array are ground terminals; and wherein said insertion terminal is located substantially at a center of said array.

8. The memory card of claim 3, wherein said array comprises nine terminals.

9. The memory card of claim 3, wherein said array comprises ten terminals.

* * * * *